US012648122B2

(12) United States Patent
Kim et al.

(10) Patent No.: US 12,648,122 B2
(45) Date of Patent: Jun. 2, 2026

(54) TRAY FOR STORING AND TRANSPORTATION OF DISPLAY DEVICE

(71) Applicant: Samsung Display Co., LTD., Yongin-si (KR)

(72) Inventors: Eui Young Kim, Yongin-si (KR); Kyung Jo Lee, Yongin-si (KR); Hong Ju Kim, Yongin-si (KR); Nam Pyo Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/921,516

(22) Filed: Oct. 21, 2024

(65) Prior Publication Data

US 2025/0311181 A1     Oct. 2, 2025

(30) Foreign Application Priority Data

Apr. 2, 2024     (KR) ........................ 10-2024-0044843

(51) Int. Cl.
H05K 13/00 (2006.01)
H10D 86/01 (2026.01)

(52) U.S. Cl.
CPC ..... *H05K 13/0084* (2013.01); *H05K 13/0015* (2013.01); *H10D 86/021* (2025.01)

(58) Field of Classification Search
CPC ........... H05K 13/0015; H05K 13/0084; H10D 86/021; B65D 81/113; B65D 85/30; B65D 81/107; B65D 81/02; B65D 85/48
USPC ................. 206/701, 557–567, 521–594, 454
See application file for complete search history.

(56) References Cited

U.S. PATENT DOCUMENTS

| | | | |
|---|---|---|---|
| 6,899,946 B2 * | 5/2005 | Geary | B32B 27/08 |
| | | | 428/319.3 |
| 9,038,824 B2 * | 5/2015 | Zhao | B65D 81/02 |
| | | | 206/453 |
| 9,227,765 B1 * | 1/2016 | Zhao | B65D 85/30 |
| 12,291,388 B2 * | 5/2025 | Uchida | B65D 81/107 |

(Continued)

FOREIGN PATENT DOCUMENTS

| | | |
|---|---|---|
| CN | 211428187 U | 9/2020 |
| CN | 211764000 U | 10/2020 |

(Continued)

*Primary Examiner* — Chun Hoi Cheung
(74) *Attorney, Agent, or Firm* — CANTOR COLBURN LLP

(57) ABSTRACT

A tray includes a tray body; and an accommodation portion disposed in the tray body and accommodating a loading target element. The accommodation portion includes an accommodation bottom portion overlapping a first surface of the loading target element and accommodation sidewall portions facing second surfaces of the loading target element disposed along a circumferential direction of the accommodation portion in a direction perpendicular to the first surface, the accommodation sidewall portions include cushion members each having a cushion surface facing a partial area of the second surfaces of the loading target element, the cushion member includes a high hardness layer having first hardness and a pair of low hardness layers in contact with the high hardness layer and having second hardness lower than the first hardness, and the high hardness layer is disposed between the pair of low hardness layers.

19 Claims, 24 Drawing Sheets

(56)                References Cited

U.S. PATENT DOCUMENTS

| | | | | |
|---|---|---|---|---|
| 2008/0128310 A1* | 6/2008 | Kao | ..................... | B65D 81/107 |
| | | | | 206/521 |
| 2011/0215019 A1* | 9/2011 | Wu | ..................... | B65D 81/113 |
| | | | | 206/523 |
| 2013/0104504 A1* | 5/2013 | Hu | ........................ | B65D 81/02 |
| | | | | 206/701 |
| 2013/0270134 A1* | 10/2013 | Chen | ..................... | B65D 81/02 |
| | | | | 53/472 |
| 2014/0069835 A1* | 3/2014 | Kuo | ..................... | B65D 81/052 |
| | | | | 206/454 |
| 2014/0097121 A1* | 4/2014 | Chen | ................... | B65D 81/053 |
| | | | | 206/586 |
| 2014/0138272 A1* | 5/2014 | Kuo | ..................... | B65D 81/107 |
| | | | | 206/454 |

FOREIGN PATENT DOCUMENTS

| | | |
|---|---|---|
| KR | 101396626 B1 | 5/2014 |
| KR | 1020200044262 A | 4/2020 |

* cited by examiner

TRAY FOR STORING AND TRANSPORTATION OF DISPLAY DEVICE

This application claims priority to Korean Patent Application No. 10-2024-0044843, filed on Apr. 2, 2024, and all the benefits accruing therefrom under 35 U.S.C. § 119, the content of which in its entirety is herein incorporated by reference.

BACKGROUND

1. Field

The disclosure relates to a tray.

2. Description of the Related Art

As the information society develops, the demand for display devices for displaying images is increased and diversified. For example, display devices are applied to various electronic devices such as smartphones, digital cameras, laptop computers, navigation devices, and smart televisions.

As the display devices, various types of display devices such as liquid crystal displays ("LCDs") and organic light-emitting displays ("OLEDs") are used. Among the display devices, an organic light-emitting display displays an image using organic light-emitting elements generating light by recombination of electrons and holes. The organic light-emitting display includes a plurality of transistors providing driving currents to the organic light-emitting elements.

In particular, display panels such as organic light-emitting display panels tend to increasingly become smaller and thinner. Accordingly, there is a need to prevent the occurrence of defects in a process of loading and transporting display devices including such display panels.

Accordingly, in general, the display device may be loaded, transported, and stored in a tray while going through various manufacturing processes, and even in a case of a finished product state, a tray in which the display device in the finished product state may be loaded is prepared and the display device in the finished product state is then loaded, packaged, and transported in the tray.

In addition, one display device may be loaded and transported in one tray, but there is a need to load, transport, and store a plurality of display devices at a time in order to improve process efficiency and loading efficiency, and accordingly, a plurality of trays may be stacked and the display devices may be stored and transported in the plurality of trays.

Such a tray is provided with a guide supporting a position of the display device accommodated inside the tray and protecting the display device when an external force such as an external impulse or vibration is applied to the display device or the movement of the display device occurs during shipping and transportation of the display device.

SUMMARY

However, since such a guide includes or consists of a substantially hard material that is the same as a material of the tray, the display device is struck by such a guide during the generation of the external force or the movement of the display device, such that damage to the display device may easily occur.

Features of the disclosure provide a tray capable of decreasing an impulsive force by increasing duration by deformation of a cushion member disposed in the tray at the moment of falling or collision.

In an embodiment, a tray includes a tray body; and an accommodation portion disposed in the tray body and accommodating a loading target element. The accommodation portion includes an accommodation bottom portion overlapping a first surface of the loading target element and accommodation sidewall portions facing second surfaces of the loading target element disposed along a circumferential direction of the accommodation portion in a direction perpendicular to the first surface, the accommodation sidewall portions include cushion members each including a cushion surface facing a partial area of the second surfaces of the loading target element, a cushion member of the cushion members includes a high hardness layer having first hardness and a pair of low hardness layers in contact with the high hardness layer and having second hardness lower than the first hardness, and the high hardness layer is disposed between the pair of low hardness layers.

In an embodiment, the loading target element includes a circuit member disposed in a partial area of the second surfaces, and the cushion surface of the cushion member is disposed to face the circuit member.

In an embodiment, the circuit member includes a plurality of avoidance grooves defined at regular intervals along a length direction thereof, and a plurality of cushion members are provided to overlap the plurality of avoidance grooves, respectively.

In an embodiment, the plurality of cushion members are disposed within a width of the circuit member along the length direction of the circuit member, and the plurality of cushion members include a first cushion member disposed to overlap an avoidance groove defined in a middle among the plurality of avoidance grooves and a pair of second cushion members disposed to be spaced apart from each other with the first cushion member interposed therebetween.

In an embodiment, widths of the first cushion member and a second cushion member of the pair of second cushion members along the length direction of the circuit member are different from each other.

In an embodiment, the tray body includes a coupling groove which is disposed adjacent to the accommodation portion and to which the cushion member is coupled.

In an embodiment, the cushion member includes a cushion bottom surface in contact with the coupling groove, a cushion top surface opposite to the cushion bottom surface, and a plurality of cushion side surfaces disposed along the circumferential direction between the cushion bottom surface and the cushion top surface, and any one of the plurality of cushion side surfaces is the cushion surface facing the circuit member.

In an embodiment, another of the plurality of cushion side surfaces is a cushion engagement surface disposed in a direction opposite to the cushion surface, and the coupling groove includes a lower accommodation groove in contact with the cushion bottom surface of the cushion member and a side surface support portion in contact with a cushion coupling surface.

In an embodiment, a height of the cushion member from the cushion bottom surface to the cushion top surface is smaller than a height of the coupling groove.

In an embodiment, widths of the high hardness layer and a low hardness layer of the pair of low hardness layers along a direction perpendicular to a cushion side surface of the plurality of cushion side surfaces are different from each other.

In an embodiment, the accommodation sidewall portions include guide portions disposed to face the remaining second surfaces excluding the circuit member among the second surfaces of the loading target element.

In an embodiment, the guide portions each protrude toward the remaining second surfaces of the loading target element accommodated in the accommodation portion.

In an embodiment, one second surface of the second surfaces of the loading target element faces the cushion surface with an interval defined therebetween, and the remaining second surfaces of the second surfaces excluding the one second surface face the guide portions with an interval defined therebetween.

In an embodiment, the tray body further includes a guide groove defined adjacent to the accommodation portion and guiding the loading target element so that the loading target element is introduced into and extracted from the accommodation portion.

In an embodiment, the cushion member further includes adhesive layers disposed between the high hardness layer and the pair of low hardness layers.

In an embodiment, the cushion member further includes medium hardness layers disposed between the high hardness layer and the pair of low hardness layers and having hardness lower than the first hardness of the high hardness layer and higher than the second hardness of the pair of low hardness layers.

In an embodiment, the cushion member further includes ultra-low hardness layers disposed at outermost portions of the pair of low hardness layers and having hardness lower than the second hardness of the pair of low hardness layers.

In an embodiment, a tray includes a tray body; and an accommodation portion disposed in the tray body and accommodating a loading target element. The accommodation portion includes an accommodation bottom portion overlapping a first surface of the loading target element and accommodation sidewall portions facing second surfaces of the loading target element disposed along a circumferential direction of the accommodation portion in a direction perpendicular to the first surface, and the accommodation sidewall portions include cushion members including first layers facing partial areas of the second surfaces of the loading target element and having a first hardness and second layers disposed in a direction opposite to the first layers and having a second hardness higher than the first hardness.

In an embodiment, the tray body includes a coupling groove to which a cushion member of the cushion members is coupled, the coupling groove includes a lower accommodation groove in contact with bottom surfaces of the first and second layers and a side surface support portion in contact with a second layer of the second layers, and a first surface of the second layer contacts a first layer of the first layers and a second surface of the second layer opposite to the first surface contacts the side surface support portion.

In an embodiment, the loading target element includes a circuit member disposed in a partial area of the second surfaces of the loading target element, and
  the first layer of the cushion member is disposed to face the circuit member.

With a tray in an embodiment, a cushion member having relatively low hardness and relatively high hardness is disposed in the tray and supports a loading target element. Accordingly, when an external force occurs, at the moment when a vibration occurs or a drop collision occurs, for example, duration may be increased by deformation of the cushion member, such that an impulsive force may be decreased, and thus, it is possible to protect the loading target element and prevent damage to the loading target element.

However, features of the disclosure are not restricted to the one set forth herein. The above and other features of the disclosure will become more apparent to one of ordinary skill in the art to which the disclosure pertains by referencing the detailed description of the disclosure given below.

BRIEF DESCRIPTION OF THE DRAWINGS

The above and other advantages and features of the disclosure will become more apparent by describing in detail embodiments thereof with reference to the attached drawings, in which.

DETAILED DESCRIPTION

Embodiments of the disclosure will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it may be directly on the other layer or substrate, or intervening layers may also be present. The same reference numbers indicate the same components throughout the specification. In the attached drawing figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Features of various embodiments of the disclosure may be combined partially or totally. As will be clearly appreciated by those skilled in the art, technically various interactions and operations are possible. Various embodiments may be practiced individually or in combination.

Hereinafter, embodiments of the disclosure will be described with reference to the accompanying drawings.

Figure 1:
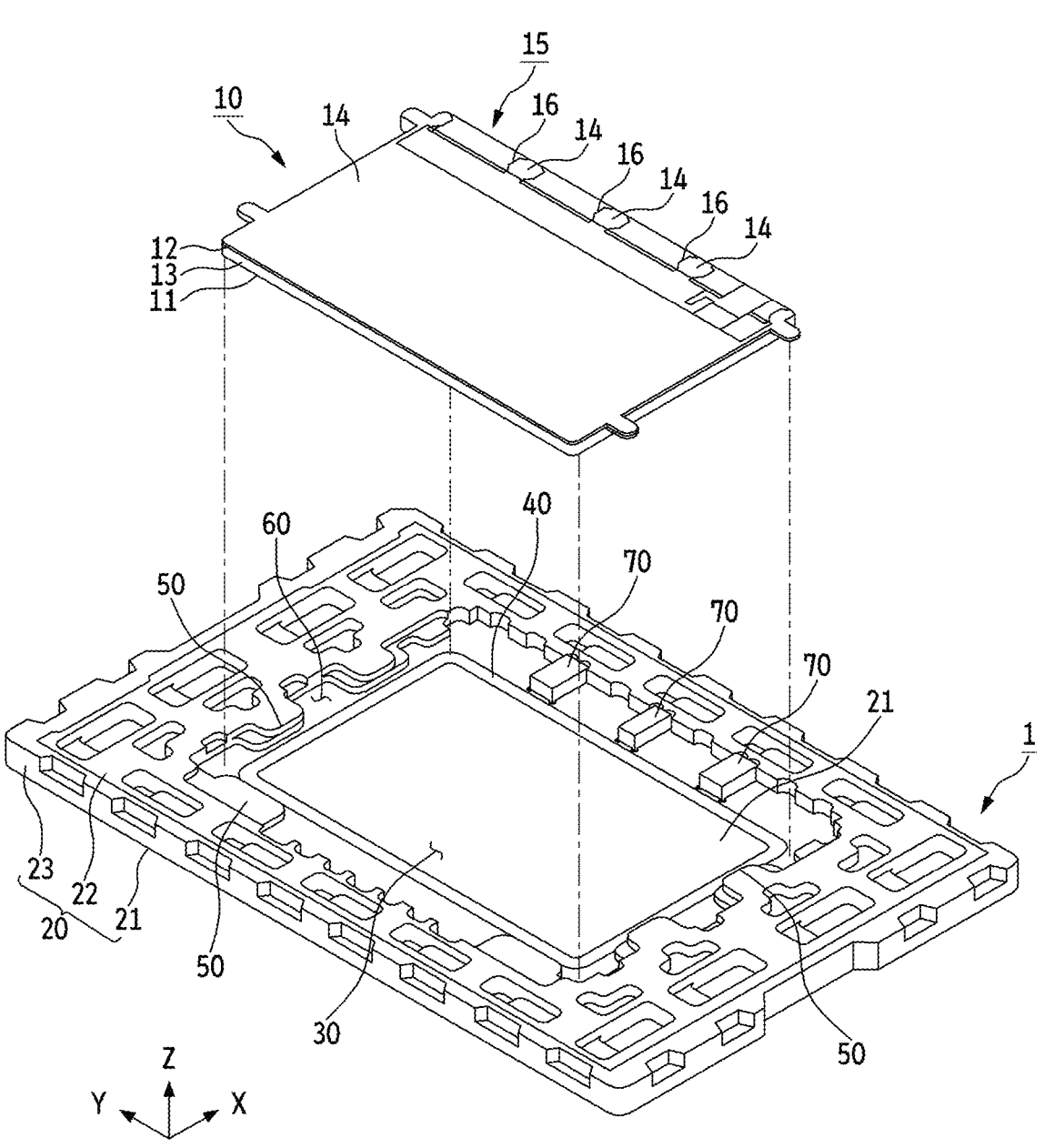
FIG. 1 is an exploded perspective view of an embodiment of a tray and a loading target element.
Figure 2:
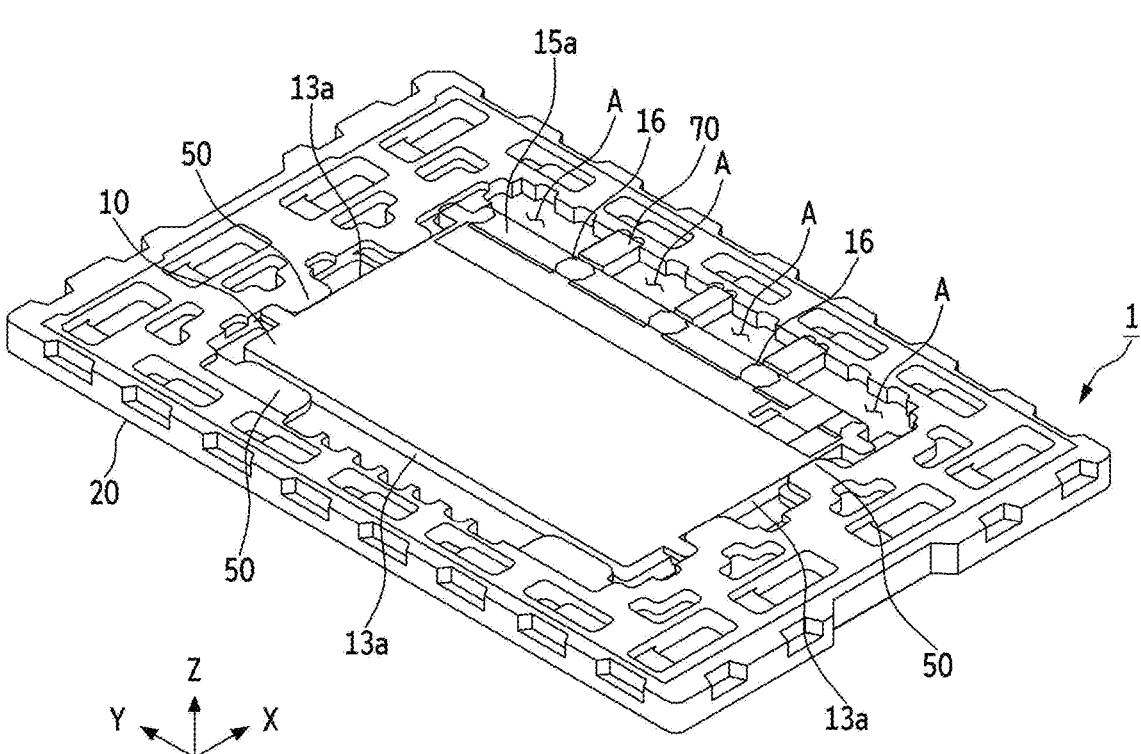
FIG. 2 is an assembled perspective view of FIG. 1.
Figure 3A:
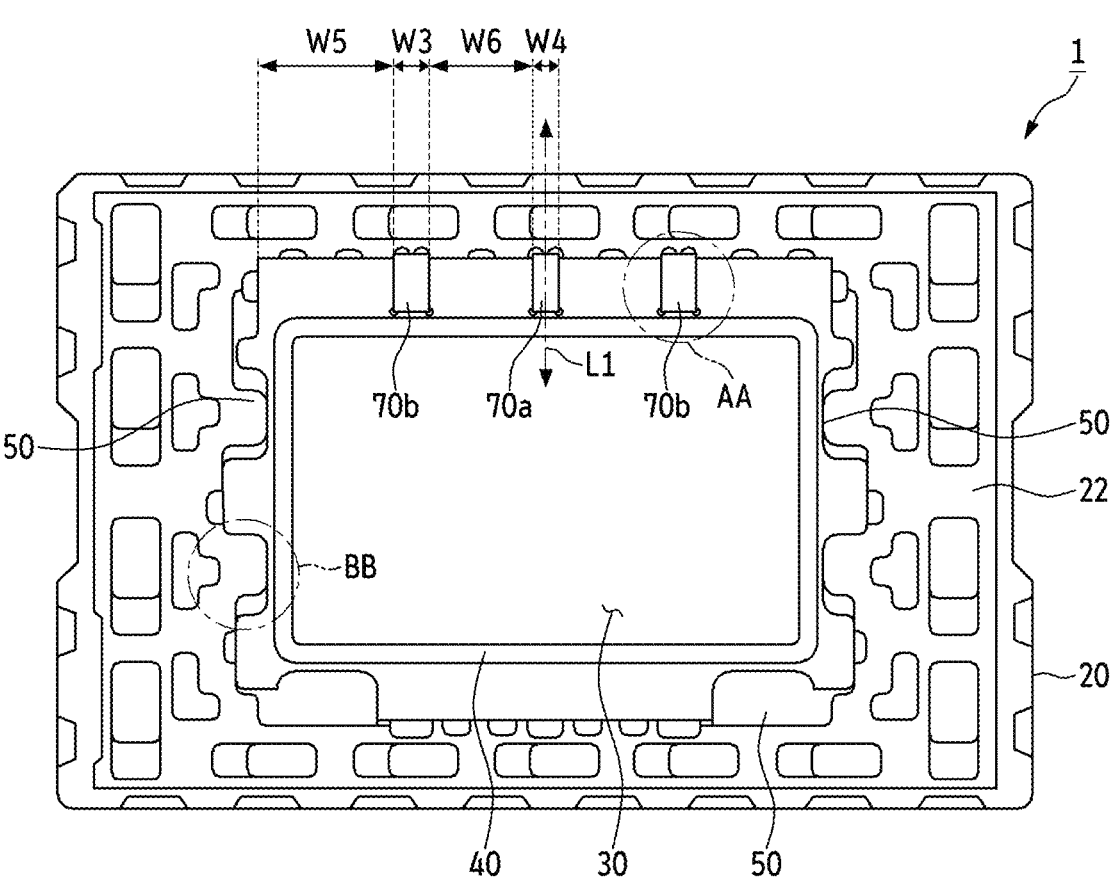
FIG. 3A is a plan view of the tray illustrated in FIG. 1.
Figure 3B:
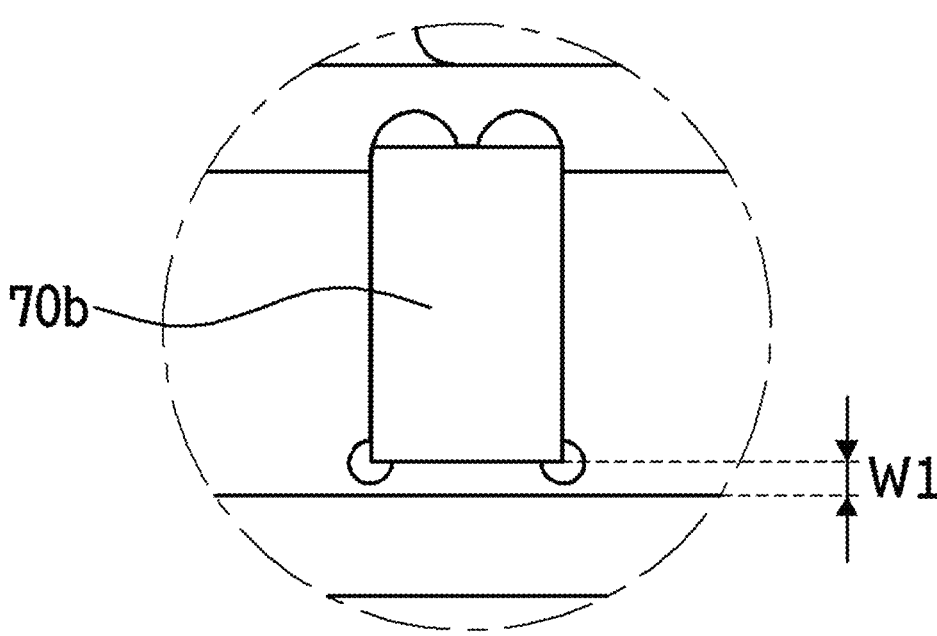
FIG. 3B is an enlarged view of portion AA of FIG. 3A.
Figure 3C:
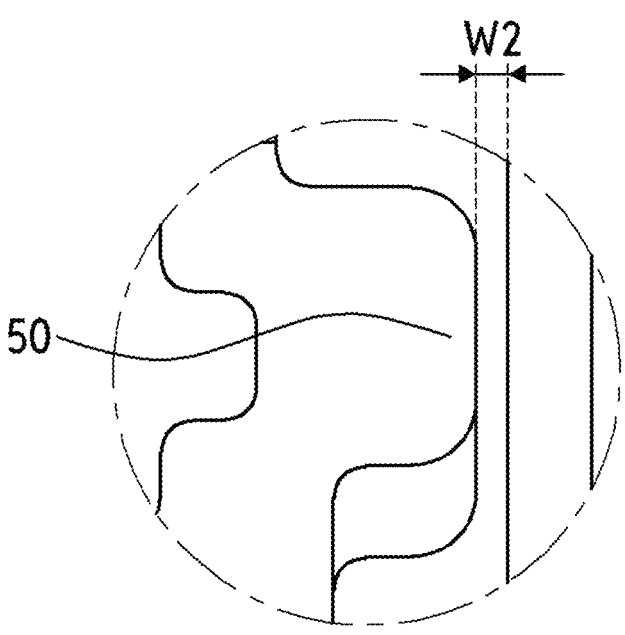
FIG. 3C is an enlarged view of portion BB of FIG. 3A.

FIG. 1 is an exploded perspective view of an embodiment of a tray and a loading target element, FIG. 2 is an assembled perspective view of FIG. 1, and FIG. 3 is a plan view of the tray illustrated in FIG. 1, FIG. 3B is an enlarged view of portion AA of FIG. 3A, and FIG. 3C is an enlarged view of portion BB of FIG. 3A.

Referring to FIGS. 1 and 2, a tray 1 serves to accommodate and store a loading target element 10, and may accommodate one loading target element 10 alone or accommodate a plurality of loading target elements 10, but is not limited thereto.

The loading target element 10 may be loaded and stored in the tray 1 or transported in a state where it is accommodated in the tray 1, and embodiments of the loading target element 10 may include circuit members such as various display devices providing display screens, such as smartphones, smart watches, tablet personal computers ("PCs"), laptop computers, and televisions ("TVs"), but are not limited thereto.

A display device 10, which is an embodiment of the loading target element 10, is completed by forming various thin films on a substrate and performing modularization, and not only an intermediate display device before the modularization but also the display device completed through the modularization may be loaded and transported and stored in the tray.

In an embodiment, in the display device 10, which is the loading target element 10, an upper surface 11 including a display unit displaying a screen may be accommodated in an accommodation portion 30 of the tray 1 to be described later and a lower surface 12 opposite to the upper surface 11 and corresponding to a rear surface of the display device 1 may be accommodated to be exposed to the outside of the tray 1, but a loading state is not limited thereto, and the lower surface 12 may also be accommodated in the accommodation portion 30.

In embodiments, the loading target element 10 may include the display device 10, and such a display device 10 may include a display panel.

The display panel may include one or more light sources providing light, and may be, e.g., a light-receiving panel including external light sources or a self-light-emitting panel including internal light-emitting elements, for example. The self-light-emitting panel includes a plurality of light-emitting elements. Example of the light-emitting element may include an organic light-emitting diode ("OLED"), a quantum dot light-emitting diode ("QDLED"), an inorganic material-based micro light-emitting diode (e.g., a "micro LED"), an inorganic material-based nano light-emitting diode (e.g., a "nano LED"), or the like.

A driving integrated chip ("IC") may be disposed (e.g., mounted) on the display panel, a flexible printed circuit board 15 may be connected to the display panel, and pads connected to the driving IC and pads connected to the flexible printed circuit board 15 may be disposed on the display panel. In addition, a main circuit board may be electrically connected to the display panel through the flexible printed circuit board (hereinafter also referred to as a flexible circuit board) 15 and may exchange signals with the driving IC. The main circuit board may provide image data, control signals, source voltages, or the like, to the display panel or flexible circuit board 15. The main circuit board may include active elements and passive elements.

The driving IC may include at least one of driving devices such as a data driver applying data signals to data lines, a gate driver applying gate signals to gate lines, and a signal controller controlling operations of the data driver and the gate driver.

The driving IC may be disposed (e.g., mounted) on the display panel using a chip on plastic method. The driving IC may be disposed (e.g., mounted) on the display panel through an anisotropic conductive film ("ACF") or disposed (e.g., mounted) on the display panel using an ultrasonic bonding method or the like without a separate anisotropic conductive film. The driving IC may be disposed (e.g., mounted) in the form of a chip on film on the flexible circuit board 15, but is not limited thereto. In this case, referring to FIGS. 1 and 2, avoidance grooves 16 may be formed at regular intervals in a driving film 15a of the flexible circuit board 15, and a protective film 14 to be described later may be exposed through the avoidance grooves 16.

The loading target element 10 may include the upper surface 11 accommodated in the tray, the lower surface 12 opposite to the upper surface 11, and circumferential surfaces 13 disposed between the upper surface 11 and the lower surface 12 and disposed along a circumferential direction. Here, the circumferential surfaces 13 may be formed as four surfaces, for example, and the flexible circuit board 15 described above may be disposed on one surface of the four surfaces and the remaining three surfaces of the four surfaces may be configured as circumferential side surfaces 13a on which the flexible printed circuit board 15 is not disposed.

The loading target element 10 may further include the protective film 14 disposed on at least one of the upper surface 11 and the lower surface 12. It has been illustrated in FIG. 1 that the protective film 14 is disposed only on the lower surface 12, but the disclosure is not limited thereto.

The protective film 14 may be attached to the loading target element 10 to protect the loading target element 10 from an external impulse and an external force and may cover the loading target element 10 so that an outer surface of the loading target element 10 is not directly exposed to the outside.

The protective film 14 may be a plastic film including or consisting of one or more selected from polyethylene terephthalate, polyethylene naphthalate, polypropylene, polycarbonate, polystyrene, polysulfone, polyethylene, polyphthalamide, polyethersulfone, polyarylate, polycarbonate oxide, and modified polythenylene oxide.

Referring to FIGS. 1 and 3A to 3C, the loading target element 10 may be accommodated inside the tray 1, and the tray 1 may serve to protect the loading target element 10 when the loading target element 10 is stored in the tray 1 and may serve to prevent damage to the loading target element 10 due to the movement of the loading target element 10 when the loading target element 10 is transported in a state where the loading target element 10 is accommodated in the tray 1.

The tray 1 may include or consist of various materials, and may include a polymer compound that may be injected in consideration of process convenience, a manufacturing cost, or the like.

Here, the polymer compound may include one or more selected from polypropylene ("PP"), polyethylene tereph- thalate ("PET"), polyvinyl chloride ("PVC"), acrylonitrile butadiene styrene ("ABS"), and polystyrene ("PS"). Here, the tray may be preferably including or consisting of a plastic resin such as acrylonitrile butadiene styrene ("ABS") copolymer or polystyrene ("PS"), but is not limited thereto.

The tray 1 may include a tray body 20 forming an appearance, the tray body 20 may have an appearance of a hexahedron, and an upper plane of the tray body 20 may be quadrangular, e.g., rectangular, but the disclosure is not limited thereto. The appearance of the tray 1 may be a polyhedron having various shapes, and the upper plane of the tray 1 may have various shapes such as a square shape, a polygon shape, and a circular shape.

The tray body 20 may include a tray lower surface 21 disposed at an installation surface of the tray 1, a tray upper surface 22 opposite to the tray lower surface 21 in a Z direction, and four tray circumferential surfaces 23 disposed along a circumferential direction of the tray 1 between the tray lower surface 21 and the tray upper surface 22. It has been illustrated in FIG. 1 that the tray 1 has a quadrangular parallelepiped shape, e.g., rectangular parallelepiped shape and the tray circumferential surfaces 23 are four surfaces, but the disclosure is not limited thereto, and the tray cir- cumferential surfaces 23 may be various surfaces such as one surface, two surfaces, four surfaces, or five surfaces depending on an entirety of the shape of the tray 1.

In the tray 1, a thickness from the tray lower surface 21 to the tray upper surface 22 along the Z direction, which is a thickness direction, may be greater than a thickness of the loading target element 10.

The tray 1 may include the accommodation portion 30, which is an accommodation space for accommodating the loading target element 10, a stopper 40 disposed inside the accommodation portion 30, and guide portions 50, guide grooves 60, and cushion members 70 that are disposed along a circumferential direction of the accommodation portion 30.

The accommodation portion 30 may have the same or similar shape as the loading target element 10 so as to accommodate the loading target device 10, and may be an accommodation space of the loading target device defined by an accommodation bottom portion 31 and accommoda- tion sidewall portions 50 and 70.

The accommodation bottom portion 31 may overlap the loading target element 10 when the loading target element 10 is accommodated in the accommodation portion 30. Accordingly, the accommodation bottom portion 31 may face the upper surface 11 (also referred to as a first surface) of the loading target element 10 accommodated in the accommodation portion 30 when it overlaps the loading target element 10 accommodated in the accommodation portion 30.

The accommodation bottom portion 31 may be stepped from the tray upper surface 22 toward the tray lower surface 21 along the Z direction, which is the thickness direction of the tray 1.

The accommodation bottom portion 31 may have a quad- rangular shape, e.g., rectangular shape in a plan view, but is not limited thereto. The accommodation bottom portion 31 may have various shapes such as a square shape, a circular shape, or an elliptical shape that is the same as the shape of the loading target element 10.

The accommodation sidewall portions 50 and 70 may be defined by the guide portions 50 and the cushion members 70 disposed along the circumferential direction of the accommodation portion 30.

The accommodation sidewall portions 50 and 70 may be disposed to face the circumferential surfaces 13 (also referred to as second surfaces) of the loading target element 10 perpendicular to the upper surface 11 of the loading target element 10 along the Z direction, which is the thickness direction of the loading target element 10 accommodated in the accommodation portion 30.

The accommodation sidewall portions 50 and 70 may be disposed to stand up from the accommodation bottom por- tion 31 toward the upper surface of the tray 22 along the Z direction, which is the thickness direction of the tray 1, and may be disposed along an edge area of the accommodation bottom portion 31.

A height of the accommodation sidewall portions 50 and 70 along the Z direction may be the same as or greater than a height of the guide portion 50 and the cushion member 70.

When the loading target element 10 is accommodated in the accommodation portion 30 having such a configuration, the upper surface 11 of the loading target device 10 may contact the accommodation bottom portion 31 and the circumferential surfaces 13 of the loading target device 10 may contact the guide portion 50 and the cushion member 70 or may be disposed at gaps, that is, at intervals W1 and W2 from the guide portion 50 and the cushion member 70 as illustrated in FIGS. 3A to 3C.

The accommodation portion 30, which is the accommo- dation space defined by the accommodation bottom portion 31 and the accommodation sidewall portions 50 and 70, may have a size corresponding to a size of the loading target element 10 so as to accommodate the loading target element 10. In an embodiment, the size of the accommodation portion 30 may be greater than the size of the loading target element 10 enough for gaps to exist between the loading target element 10 accommodated in the accommodation portion 30 and the accommodation sidewall portions 50 and 70 or be the same as the size of the loading target element 10, for example, but is not limited thereto. The size of the accommodation portion 30 is not limited as long as it is enough to introduce and extract the loading target element 10 into and from the accommodation portion.

The guide portions 50 may be disposed in a pair of short side directions, which are an X direction, and disposed in one long side direction in which the flexible circuit board 15 is not disposed, of a pair of long side directions, which are a Y direction, in the tray 1 having a quadrangular shape, e.g., rectangular shape.

When the loading target element 10 is the display device 10, the guide portions 50 may support the remaining cir- cumferential side surfaces 13a of the display device 10 except for one surface of the display device 10 on which the flexible circuit board 15 of the display device 10 is disposed. That is, the guide portions 50 may be disposed to face the remaining circumferential side surfaces 13a excluding the flexible printed circuit board 15 among the circumferential surfaces 13 of the loading target element 10.

A plurality of guide portions 50 may be formed to protrude toward the loading target element 10 in the accommodation portion 30, may guide the loading target element 10 so that the loading target element 10 is introduced into the accommodation portion 30, and may be disposed along the circumferential direction of the accommodation portion 30. The guide portions 50 may be spaced apart from the loading target element 10 by an interval W2 or may contact the loading target element 10 to serve to support the circumferential side surfaces 13a of the loading target element 10.

The guide groove 60 may serve to extract the loading target element 10 from the accommodation portion 30. In an embodiment, the loading target element 10 accommodated in the accommodation portion 30 may be separated from the accommodation portion 30 or the loading target element 10 may be accommodated in the accommodation portion 30 by inserting a worker or user's finger or a predetermined instrument into the guide groove 60, for example. In this way, the loading target element 10 may be easily attached to and detached from the accommodation portion 30 by the guide groove 60.

The stopper 40 may minimize vertical movement of the loading target element 10, may prevent damage to the loading target element 10, and may be formed along an outer edge area of the accommodation bottom portion 31 of the tray 1 and thus reinforce lower strength of the tray 1. In particular, the stopper 40 may prevent an appearance of the tray 1 from being changed due to a storage environment and a transportation environment of the tray 1. In an embodiment, the stopper 40 may prevent the tray 1 from being bent or distorted, for example.

The stopper 40 may be formed along the circumferential direction of the tray 1 at the accommodation bottom portion 31 and may be formed in various shapes such as a polygonal shape and an elliptical shape, but is not limited thereto.

Figure 4:
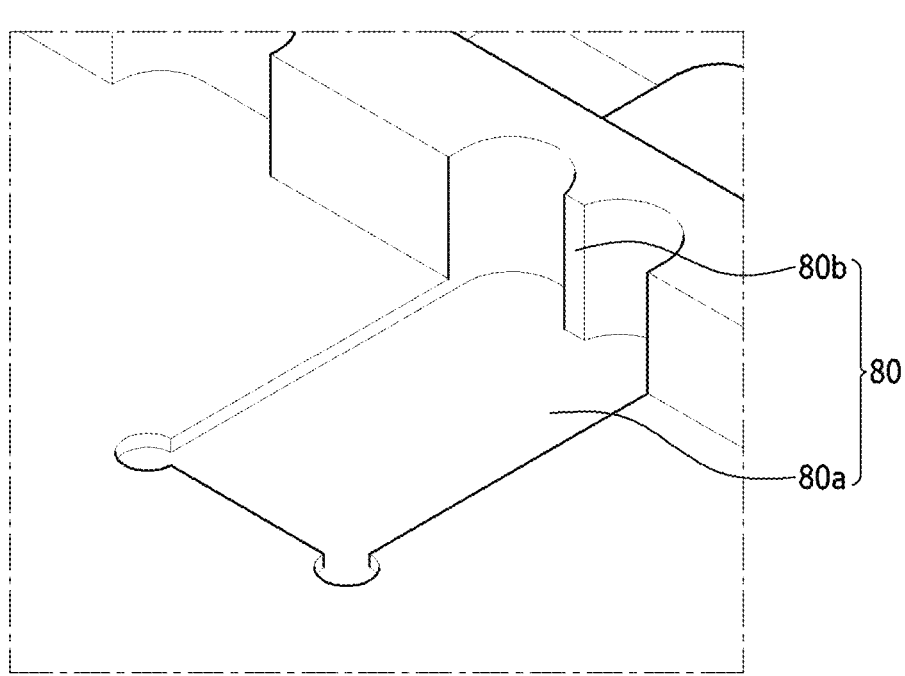
FIG. 4 is an enlarged view of a cushion member coupling groove illustrated in FIG. 1.
Figure 5:
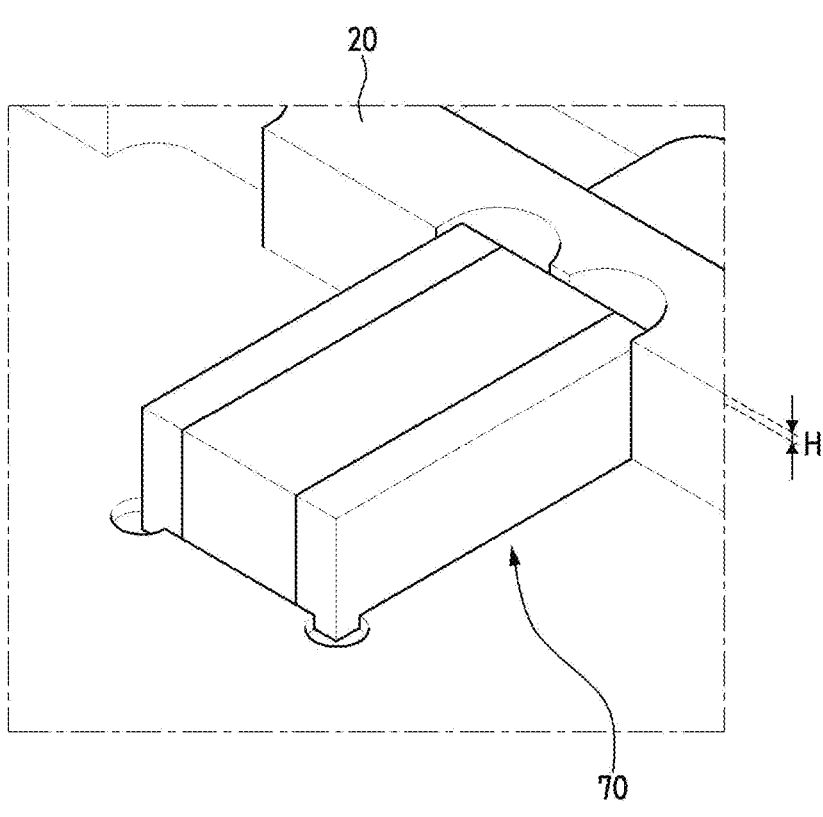
FIG. 5 is an enlarged view of a state where a cushion member is coupled to the cushion member coupling groove of FIG. 4.
Figure 6:
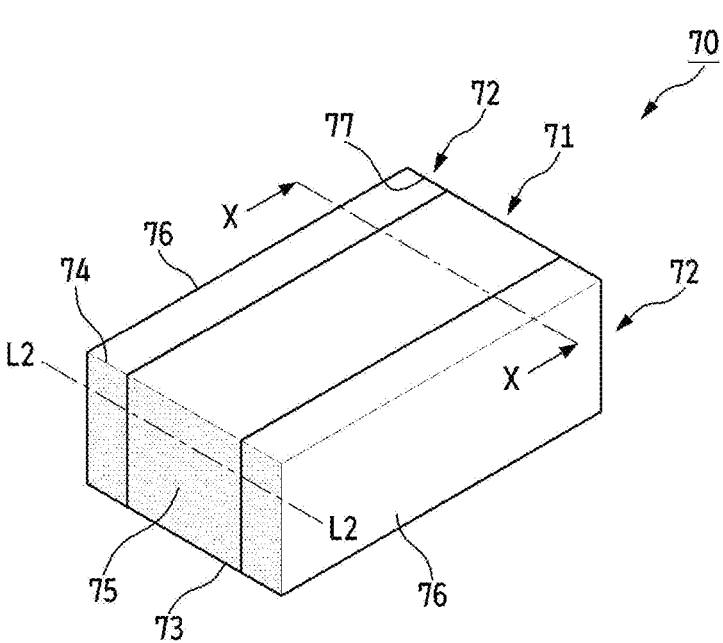
FIG. 6 is an enlarged perspective view of the cushion member of FIG. 5.
Figure 7:
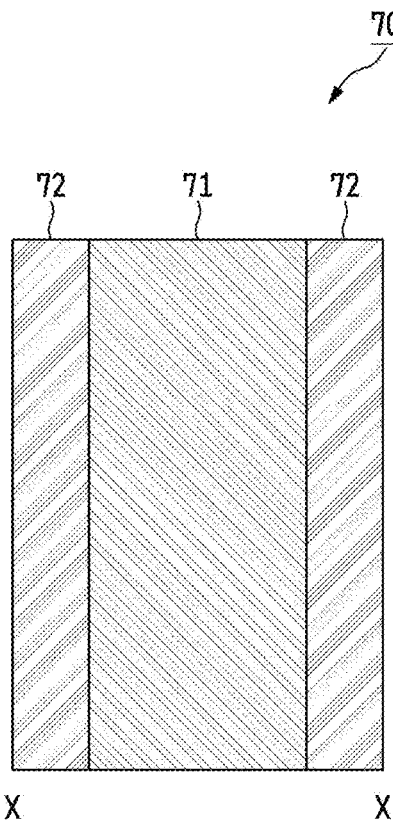
FIG. 7 is a cross-sectional view of the cushion member taken along line X-X in FIG. 6.
Figure 8:
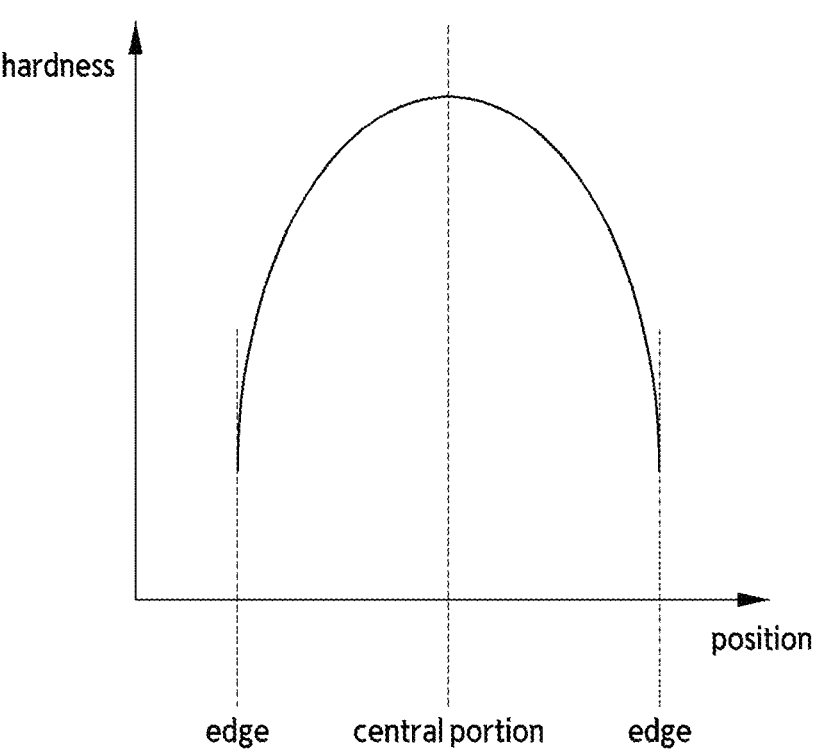
FIG. 8 is a graph illustrating hardness according to positions of low hardness layers disposed in edge areas of the cushion member and a high hardness layer disposed at a center portion of the cushion member.

FIG. 4 is an enlarged view of a cushion member coupling groove illustrated in FIG. 1, FIG. 5 is an enlarged view of a state where a cushion member is coupled to the cushion member coupling groove of FIG. 4, FIG. 6 is an enlarged perspective view of the cushion member of FIG. 5, FIG. 7 is a cross-sectional view of the cushion member taken along line X-X in FIG. 6, and FIG. 8 is a graph illustrating hardness according to positions of low hardness layers disposed in edge areas of the cushion member and a high hardness layer disposed at a center portion of the cushion member.

Referring to FIGS. 4 and 5, the cushion member 70 may be coupled to a coupling groove 80 disposed in the tray body 20 of the tray 1, and may be coupled to the coupling groove 80 disposed on one side of an edge area of the accommodation portion 30 so as to support one surface of the loading target element 10 accommodated in the accommodation portion 30.

The coupling groove 80 may include a lower accommodation groove 80a recessed inward in the tray body 20 and a side surface support portion 80b supporting a cushion coupling surface 77 of a cushion member 70 to be described later.

The lower accommodation groove 80a of the coupling groove 80 may accommodate a cushion bottom surface 73 of a cushion member 70 (to be described later) accommodated in the coupling groove 80, and the side surface support portion 80b of the coupling groove 80 may contact and serve to support the cushion coupling surface 77 of the cushion member 70 in a state where the cushion member 70 is accommodated in the lower accommodation groove 80a.

The cushion member 70 may preferably include or consist of polyethylene ("PE") foam or ethylene vinyl acetate ("EVA") foam with different hardness in order to protect the loading target element 10 and cushion an impulse, but is not limited thereto, and may include or consist of various materials with different hardness.

When the loading target element 10 is the display device 10, the cushion member 70 may be disposed on one surface of the display device 10 where the driving film 15a of the flexible circuit board 15 of the display device 10 is disposed to serve to cushion an impulse and may be disposed to correspond to the avoidance groove 16 of the driving film 15a so as not to be in direct contact with the driving film 15a of the flexible circuit board 15, as illustrated in FIGS. 2 to 3C.

As described above, a plurality of cushion members 70 may be provided to respectively overlap the avoidance grooves 16 disposed in the driving film 15a of the flexible circuit board 15.

The plurality of cushion members 70 may be disposed to correspond to one side surface of the loading target element 10 accommodated in the accommodation portion 30 or the cushion member 70 may be disposed in the shape of one long block, but the disclosure is not limited thereto. Here, when the plurality of cushion members 70 is provided, the plurality of cushion members 70 may be disposed to correspond to the avoidance grooves 16 and may not be disposed in an area where the avoidance grooves 16 are not formed.

When the plurality of cushion members 70 is provided, as illustrated in FIGS. 2 to 3C, a separation space A may be defined between the plurality of cushion members 70, and the plurality of cushion members 70 may be spaced apart from each other with such a separation space A defined therebetween. In an embodiment, when three cushion members 70a and 70b are provided as illustrated in FIG. 3A, a first cushion member 70a disposed in the middle may be disposed on a reference line L1 disposed at the center of the tray 1 and a pair of second cushion members 70b may be disposed on opposite sides of the first cushion member 70a with the first cushion member 70a interposed therebetween, for example. However, the disclosure is not limited thereto.

A width W4 of the first cushion member 70a of FIG. 3A may be the same as or different from a width W3 of the second cushion member 70b. In addition, widths of the separation spaces A in FIG. 2 may be the same as or different from each other. In addition, based on a state illustrated in FIG. 2, a width W5 of the separation space A between one surface of the tray 1 and the second cushion member 70b disposed at the outermost portion may be the same as or different from a width W6 of the separation space A between the first cushion member 70a and the second cushion member 70b.

Referring to FIG. 6, the cushion member 70 may have a hexahedral shape, but is not limited thereto, and may also have a hexahedron having various polygonal shapes.

When the cushion member 70 has the hexahedral shape, the cushion member 70 may include the cushion bottom surface 73 in contact with the coupling groove 80, a cushion top surface 74 opposite to the cushion bottom surface 73, and a plurality of cushion side surfaces 75, 76, and 77 disposed along the circumferential direction between the cushion bottom surface 73 and the cushion top surface 74.

A height of the cushion member 70 from the cushion bottom surface 73 to the cushion top surface 74 may be smaller than a height of the coupling groove 80 by a predetermined height H illustrated in FIG. 5, but is not limited thereto, and may also be the same as the height of the coupling groove 80.

The plurality of cushion side surfaces may include a cushion surface 75 facing the avoidance groove 16 disposed in the driving film 15a of the flexible circuit board 15, the cushion coupling surface 77 disposed in a direction opposite to the cushion surface 75 and in contact with the side surface support portion 80b, and a pair of cushion side surfaces 76 facing each other, as illustrated in FIG. 6.

That is, when the cushion member 70 is coupled to the coupling groove 80, based on FIG. 5, the cushion bottom surface 73 of the cushion member 70 may be partially accommodated in the lower accommodation groove 80a (refer to FIG. 4) of the coupling groove 80, and the cushion coupling surface 77 of the cushion member 70 may contact the side surface support portion 80b of the coupling groove 80.

In addition, the cushion surface 75 is disposed to be spaced apart from the avoidance groove 16 with a gap W1 defined therebetween in a normal state, but when the loading target element 10 is pushed toward the cushion member 70 by an external force or impulse in an abnormal state, the protective film 14 of the display device 10 exposed through the avoidance groove 16 of the display device 10, which is the loading target element 10, contacts and is cushioned by the cushion surface 75.

When the cushion member 70 is coupled to the coupling groove 80, the cushion member 70 may be attached to the coupling groove 80 by applying an adhesive or coupled to the coupling groove 80 using a separate adhesive tape, but is not limited thereto. Here, the cushion member 70 may be stably fixed to the coupling groove 80 through the adhesive or the adhesive tape without the need to form a separate structure.

Referring to FIG. 6, the cushion member 70 may include a pair of low hardness layers 72 disposed in opposite edge areas of the cushion surface 75 and a high hardness layer 71 disposed between the pair of low hardness layers 72, based on the cushion surface 75 in contact with the loading target element 10.

Here, hardness refers to ability of a material of an object to withstand pressing a surface of the object, and relatively low hardness may be Shore hardness (Shore A) of 10 to 20 and relatively high hardness may be Shore hardness exceeding 20 and 90 or less, but the disclosure is not limited thereto. The hardness may be classified into relatively low hardness and relatively high hardness depending on a hardness measurement method, and there may be various hardness measurement methods that indicate hardness, such as Rockwell hardness and Mohs hardness in addition to Shore hardness.

In an embodiment, the low hardness layer 72 of the cushion member 70 may have Shore hardness (Shore A) of 10 to 20, preferably 10, based on a Shore hardness (Shore A) value, for example, but is not limited thereto, and may have relatively lower hardness than the high hardness layer.

Referring to FIGS. 6 and 7, the low hardness layer 72 of the cushion member 70 may solve a stress concentration phenomenon occurring in the edge area based on the cushion surface 75 in contact with the loading target element 10, and may make a stress distribution on the loading target element 10 and the cushion surface 75 of the cushion member 70 flat.

Specifically, the low hardness layer 72 of the cushion member 70 may be disposed at the outermost portion of the cushion member 70 to protect the loading target element 10 while serving as a cushion material protecting the cushion member 70 from an internal impulse occurring inside. That is, the low hardness layer 72 may prevent the stress concentration phenomenon in which stress is concentrated in the edge area of the cushion member 70.

The low hardness layers 72 of the cushion member 70 may be provided as a pair, may be integrated with the high hardness layer 71 or attached to the high hardness layer 71 through separate adhesive layers interposed therebetween.

A thickness of the low hardness layer 72 of the cushion member 70 may be the same as that of the high hardness layer 71 or be smaller than that of the high hardness layer 71, but is not limited thereto.

The low hardness layer of the cushion member may include or consist of low hardness foam having relatively low hardness, and may include one or more selected from relatively low density polyethylene ("LDPE"), irradiated cross-linked polyethylene ("IXPE"), non cross-linked polyethylene ("NPE"), and ethylene vinyl acetate ("EVA"), but is not limited thereto.

The high hardness layer 71 of the cushion member 70 may be disposed at a central portion of the cushion surface 75 in contact with the loading target element 10, and may have relatively higher hardness than that of the low hardness layer 72. In an embodiment, the high hardness layer 71 may have Shore hardness (Shore A) exceeding 00 and 90 or less, preferably exceeding 20 and 30 or less, based on a Shore hardness (Shore A) value, for example, but is not limited thereto.

The high hardness layer of the cushion member 70 may be disposed at the center of the cushion member 70 and may serve to protect the loading target element 10 from an external impulse generated from the outside. Specifically, the high hardness layer 71 may prevent the loading target element 10 from colliding with a wall of the tray 1 by limiting displacement of the loading target element 10 due to the relatively high hardness.

Referring to FIGS. 7 and 8, the high hardness layer 71 of the cushion member may be disposed at a central portion of the cushion member 70 or be biased from the central portion to the left or the right based in a cross-section of FIG. 7. As illustrated in FIG. 8, the central portion of the cushion member 70 exhibits relatively high hardness when the high hardness layer 71 is disposed at the central portion of the cushion member 70 and opposite edge areas of the cushion member 70 exhibit relatively low hardness when the pair of low hardness layers 72 are disposed at the outermost portions of the high hardness layer 71, such that composite hardness may be provided in one cushion member 70.

The high hardness layer 71 of the cushion member 70 may be integrated with the low hardness layers 72 or coupled to the low hardness layers 72 through separate adhesive layers interposed therebetween.

A thickness of the high hardness layer 71 of the cushion member 70 may be the same as that of the low hardness layer 72 or be smaller than that of the low hardness layer 72, but is not limited thereto.

The high hardness layer 71 of the cushion member 70 may include or consist of high hardness PE or EVA foam having relatively high hardness, but is not limited thereto. In another embodiment, the high hardness layer 71 may include one or more selected from polymethyl methacrylate ("PMMA"), polyacrylonitrile ("PAN"), polyacrylic acid ("PAA"), acrylonitrile butadiene styrene resin ("ABS"), nitrile butadiene rubber ("NBR"), and polyurethane ("PU").

The low hardness layers 72 and the high hardness layer 71 included in the cushion member 70 as described above may be formed separately and bonded to each other by heat or bonded to each other using an adhesive. In addition, preferably, the cushion member 70 may include or consist of PE or EVA foam with different hardness, but is not limited thereto.

Hereinafter, a cushion process of the cushion member 70 when an external force is generated on the loading target element 10 accommodated in the tray 1 will be described with reference to FIGS. 9A to 12.

Figure 9A:
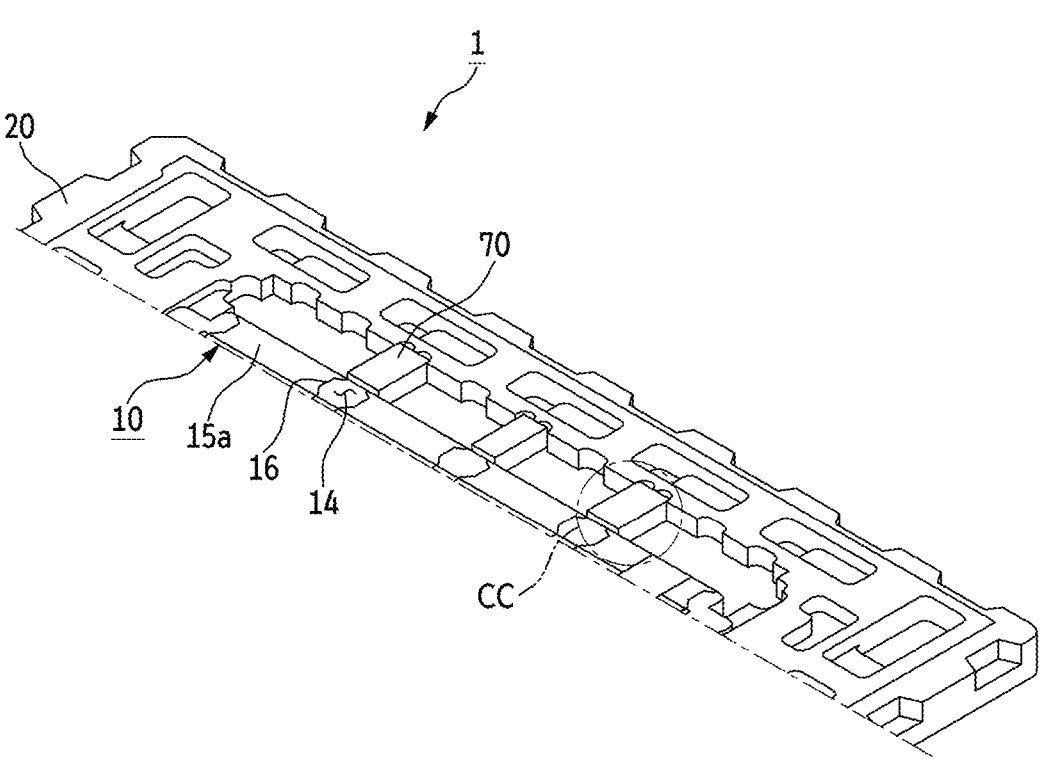
FIG. 9A is an enlarged view of a cushion member installation area of FIG. 2 before an external force is generated on the loading target element.
Figure 9B:
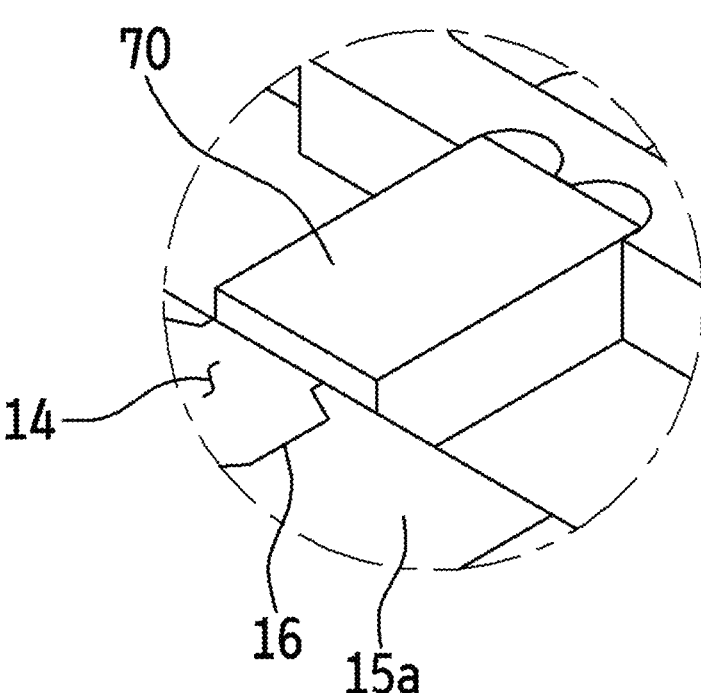
FIG. 9B is an enlarged view of portion CC of FIG. 9A.
Figure 10A:
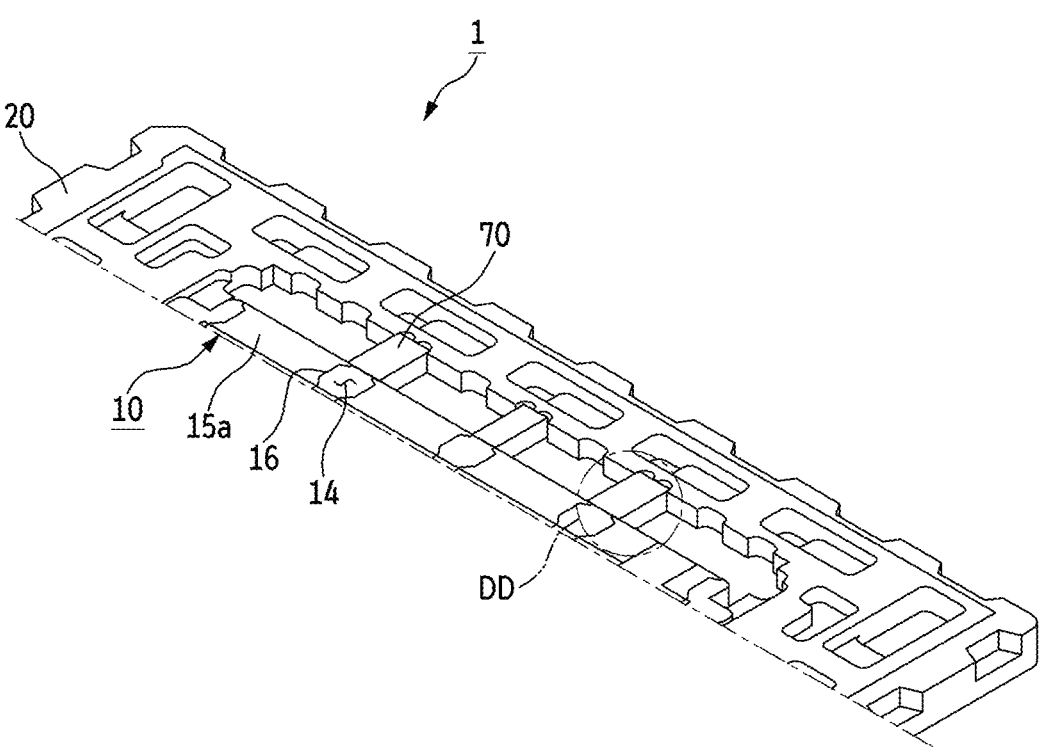
FIG. 10A is a view illustrating a state where the external force is generated on the loading target element in FIG. 9A and the loading target element contacts the cushion member.
Figure 10B:
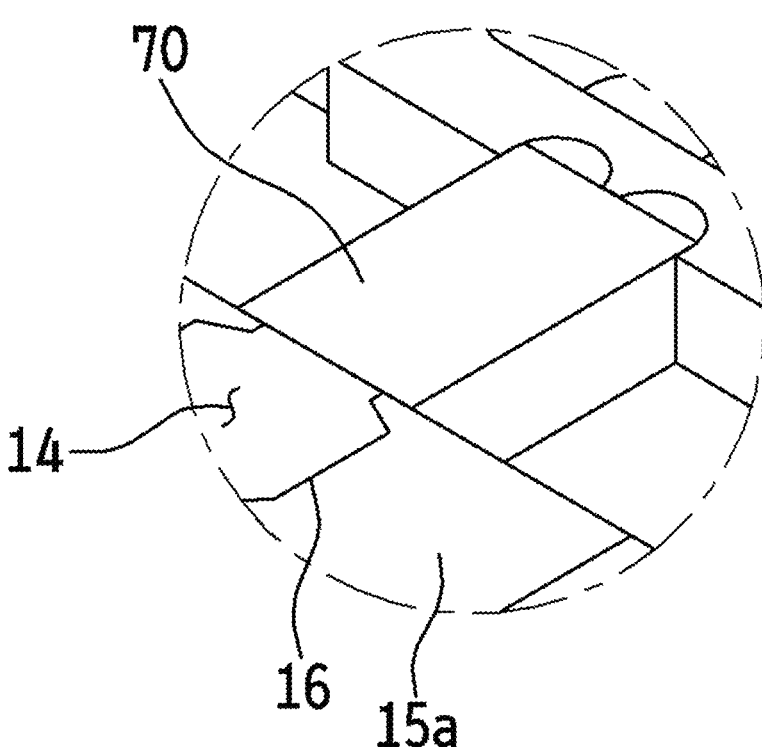
FIG. 10B is an enlarged view of portion DD of FIG. 10A.
Figure 11A:
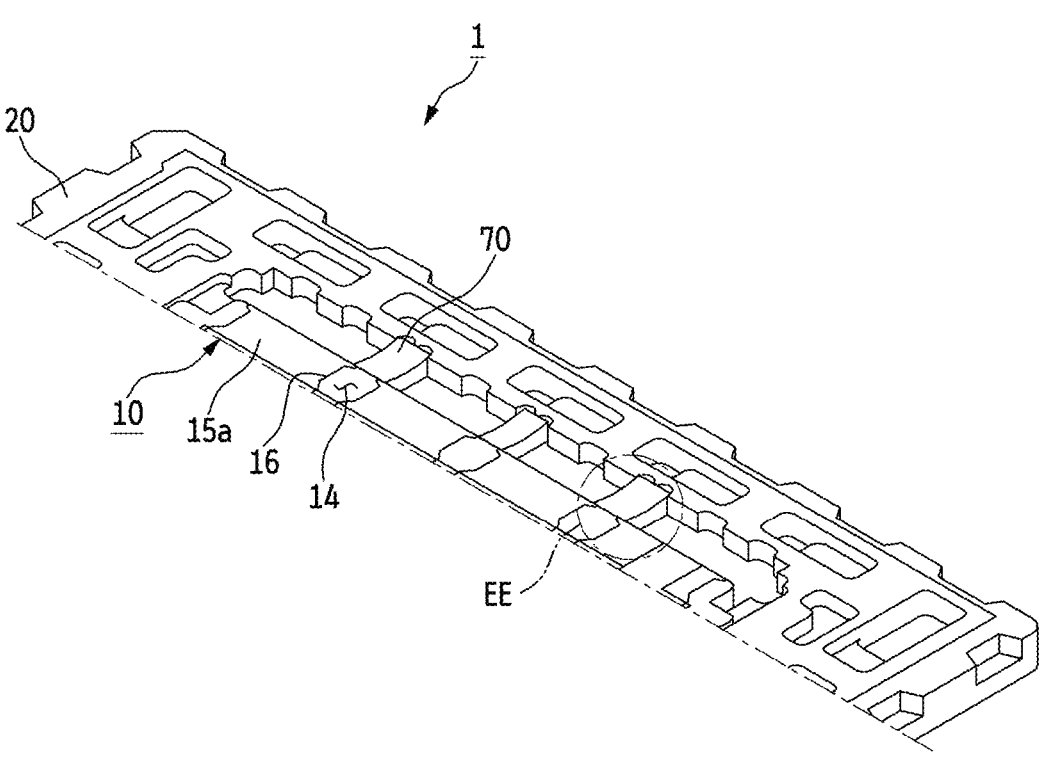
FIG. 11A is a view illustrating a state where the cushion member performs cushioning while being pressed by the loading target element in FIG. 9A.
Figure 11B:
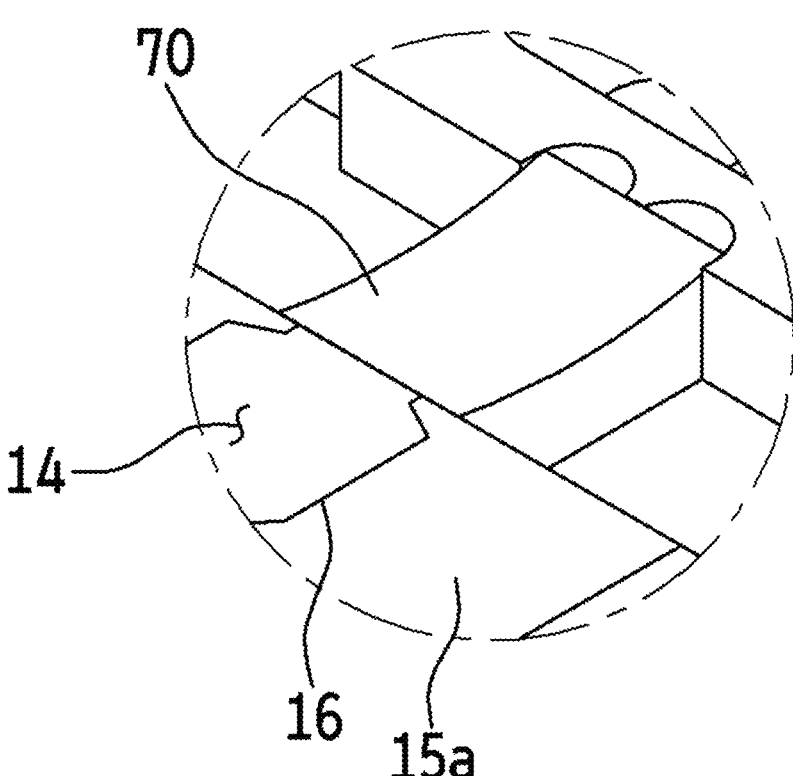
FIG. 11B is an enlarged view of portion EE of FIG. 11A.
Figure 12:
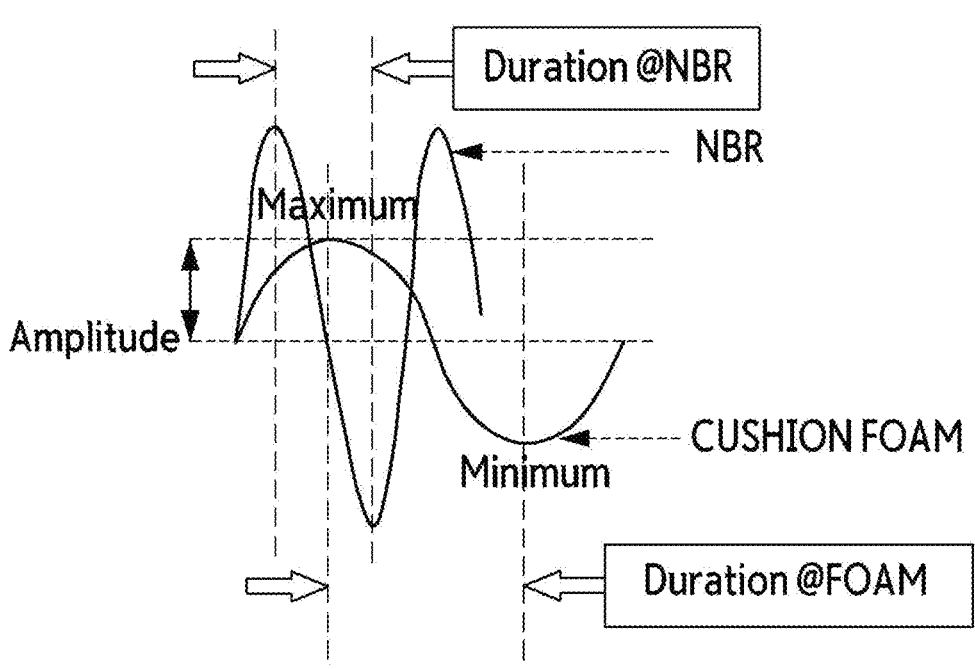
FIG. 12 is a graph illustrating a cushion action of the cushion member according to FIGS. 9A to 11B.

FIG. 9A is an enlarged view of a cushion member installation area of FIG. 2 before an external force is generated on the loading target element, FIG. 9B is an enlarged view of portion CC of FIG. 9A, FIG. 10A is a view illustrating a state where the external force is generated on the loading target element in FIG. 9A and the loading target element contacts the cushion member, FIG. 10B is an enlarged view of portion DD of FIG. 10A, FIG. 11A is a view illustrating a state where the cushion member performs cushioning while being pressed by the loading target element in FIG. 9A, FIG. 11B is an enlarged view of portion EE of FIG. 11A, and FIG. 12 is a graph illustrating a cushion action of the cushion member according to FIGS. 9A to 11B.

Referring to FIGS. 9A and 9B, which is a state before an external force such as an external impulse acts on the loading target element 10, in a state where the cushion surface 75 of the cushion member 70 and the driving film 15a of the loading target element 10 is disposed with an interval defined therebetween, when the external force occurs as illustrated in FIGS. 10A and 10B, that is, when the external force is generated on the loading target element 10 in a direction in which the loading target element 10 faces the cushion surface 75 of the cushion member 70, the loading target element 10 comes into close contact with the cushion surface 75 of the cushion member 70 while moving toward the cushion surface 75 of the cushion member 70, as illustrated in FIGS. 10A and 10B, and the cushion member 70 cushions the impulse by absorbing the impulse while being pressed by the loading target element 10, as illustrated in FIGS. 11A and 11B.

In a state of FIGS. 11A and 11B, since the cushion member 70 includes the low hardness layers 72 in opposite edge areas of the cushion surface 75, the low hardness layers 72 may prevent the loading target element 10 from being damaged due to the impulse by alleviating stress concentration, and when the external force applied to the loading target element 10 is excessively great, the high hardness layer 71 disposed in a central area of the cushion surface 75 may suppress displacement of the loading target element 10 to prevent the cushion member 70 from being too much deformed so as to prevent a phenomenon in which the cushion member 70 is pressed by a great force and accordingly, the loading target element 10 contacts an inner wall of the tray 1.

Specifically, referring to FIG. 12, in a case of a cushion member formed as a single layer and including or consisting of NBR having relatively high hardness, duration is short, such that an impulsive force exhibits a substantially high peak in a short time, whereas in a case of the cushion member 70 including composite layers including or consisting of low hardness foam and high hardness foam, when an impulse occurs, the cushion member 70 is deformed, such that duration increases, and accordingly, an impulsive force decreases. Therefore, the cushion member 70 may protect the loading target element 10 from the impulse. That is, at the moment when the impulse is applied to the loading target element 10, the duration may be increased by deformation of the cushion member 70, the stress concentration may be prevented by the low hardness layers 72 of the cushion member 70, and the impulsive force may be decreased, such that it is possible to prevent the loading target element 10 from being damaged and protect the loading target element 10.

As described above, the cushion member 70 may include the composite layers 71 and 72 having different hardness, that is, the composite layers 71 and 72 having composite hardness, and in such a state, the cushion surface 75 of the cushion member 70 may contact one side, e.g., the avoidance groove 16 of the driving film 15a, of the loading target element 10. Accordingly, the cushion member 70 may cushion an impulse received by the loading target element 10 when an external impulse is applied to the loading target element 10.

Hereinafter, cushion members according to other embodiments will be described with reference to FIGS. 13 to 21. FIGS. 13 to 17 are perspective cross-sectional views taken along line L2-L2 illustrated in FIG. 6.

Figure 13:
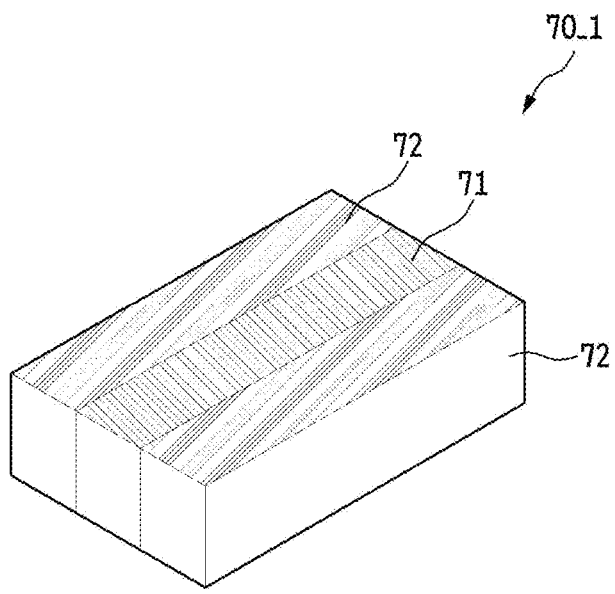
FIGS. 13 to 21 are views illustrating other embodiments of cushion members.

FIG. 13 is a perspective cross-sectional view of another embodiment of a cushion member.

Referring to FIG. 13, a cushion member 70_1 may include low hardness layers 72 and a high hardness layer 71, and may be the same as the cushion member 70 of FIG. 6 except that widths of the low hardness layer 72 and the high hardness layer 71 are the same as each other.

Figure 14:
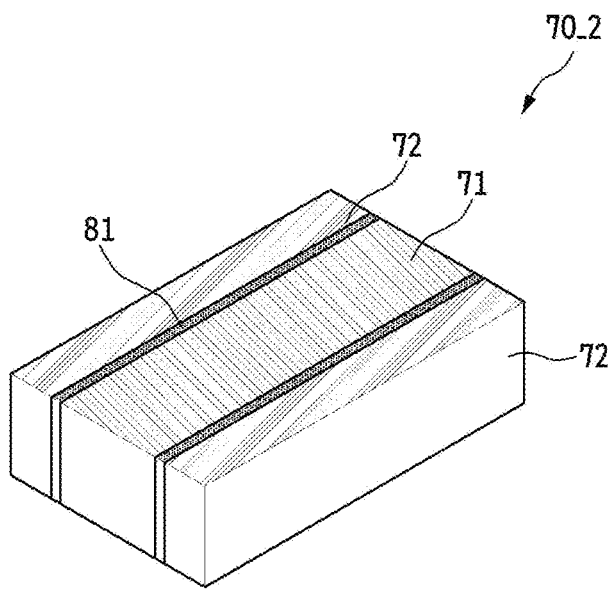

Referring to FIG. 14, a cushion member 70_2 includes low hardness layers 72 and a high hardness layer 71, and is different from the cushion member 70 in an embodiment of FIG. 6 in that it further includes adhesive layers 81.

A pair of low hardness layers 72 may be disposed at the outermost portions of the cushion member 70_2, a pair of adhesive layers 81 may be disposed inside the pair of low hardness layers 72, and a high hardness layer 71 may be disposed between the pair of adhesive layers 81.

The adhesive layer 81 may be disposed between the low hardness layer 72 and the high hardness layer 71 to bond the low hardness layer 72 and the high hardness layer 71 to each other. In this way, when the cushion member 70_2 includes a separate adhesive layer 81, a coupling force of each layer may be improved.

Figure 15:
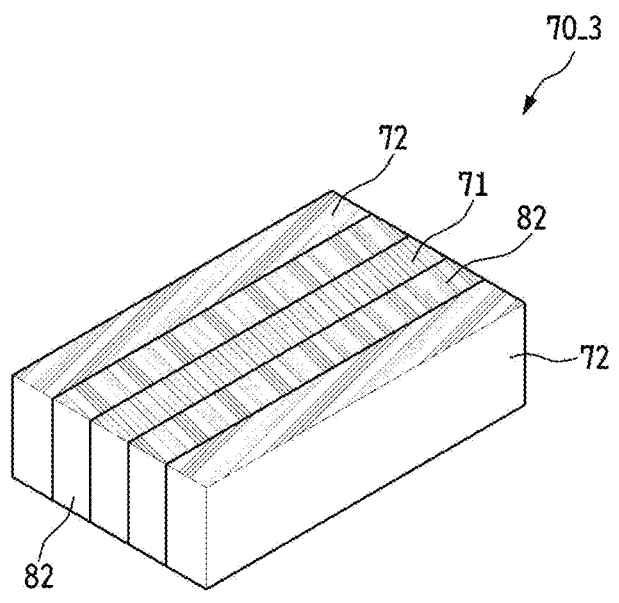

FIG. 15 is a perspective cross-sectional view of another embodiment of a cushion member.

Referring to FIG. 15, a cushion member 70_3 may include low hardness layers 72 and a high hardness layer 71, and may be the same as the cushion member 70 in an embodiment of FIG. 6 except that it further includes medium hardness layers 82.

A pair of medium hardness layers 82 may be disposed outside the high hardness layer 71. Specifically, the medium hardness layers 82 may be disposed between the low hardness layers 72 and the high hardness layer 71.

Hardness of the medium hardness layer 82 may be higher than hardness of the low hardness layer 72 and lower than hardness of the high hardness layer 71, and the medium hardness layer 82 may have medium hardness and may serve to evenly adjust hardness of the cushion surface 75 between the low hardness layer 72 and the high hardness layer 71.

Figure 16:
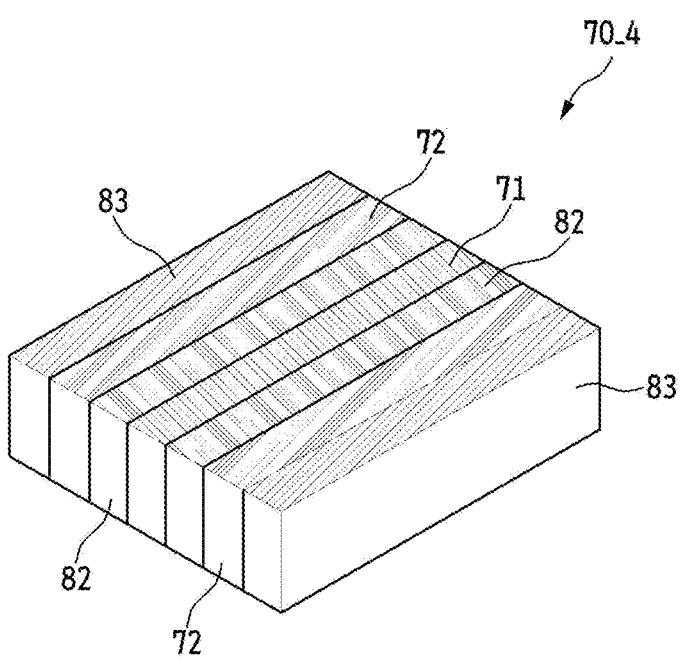

FIG. 16 is a perspective cross-sectional view of another embodiment of a cushion member.

Referring to FIG. 16, a cushion member 70_4 includes a high hardness layer 71, medium hardness layers 82, and low hardness layers 72, and is different from the cushion member 70_3 in another embodiment of FIG. 15 in that it further includes ultra-low hardness layers 83.

The ultra-low hardness layers 83 may be disposed at the outermost portions of the cushion member 70_4, and may have hardness lower than hardness of the low hardness layers 72. When the cushion member 70_4 includes the ultra-low hardness layers 83 at the outermost portions, the ultra-low hardness layers 83 may contact the loading target element 10 with the lowest hardness to solve stress concentration, and accordingly, the possibility of damage to the loading target element 10 may be further reduced. The cushion member 70_4 may further include the medium hardness layers 82 and the ultra-low hardness layers 83 to provide an even hardness distribution on the cushion surface 75, and accordingly, cushion capacity of the cushion member 70_4 may be further improved.

Figure 17:
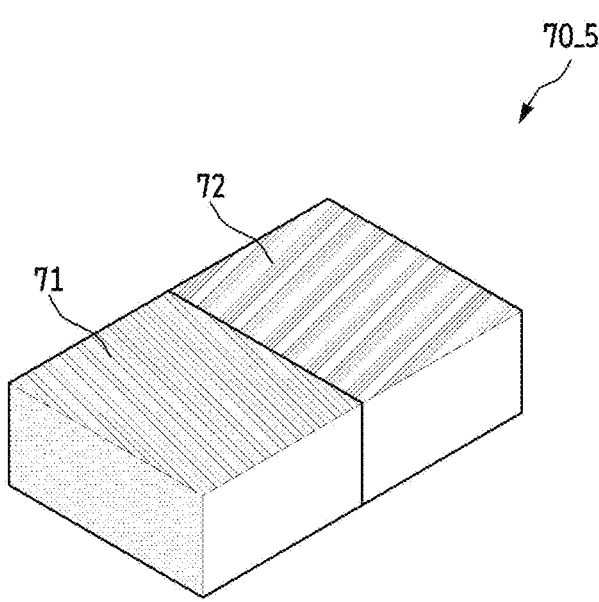

FIG. 17 is a perspective cross-sectional view of another embodiment of a cushion member.

Referring to FIG. 17, a cushion member 70_5 may include a low hardness layer 72 disposed on a front surface thereof and a high hardness layer 71 disposed on a rear surface thereof.

The low hardness layer 72 may include the cushion surface 75 and contact the loading target element 10, and may have relatively lower hardness than that of the high hardness layer 71.

The high hardness layer 71 may contact the side surface support portion 80*b* (refer to FIG. 4) of the coupling groove 80, and may have relatively higher hardness than that of the low hardness layer 72.

The low hardness layer 72 may protect the loading target element 10 when an external force occurs from the inside, and the high hardness layer 71 may serve to cushion an impulse transferred from the outside of the tray 1 to the inside of the tray 1.

Figure 18:
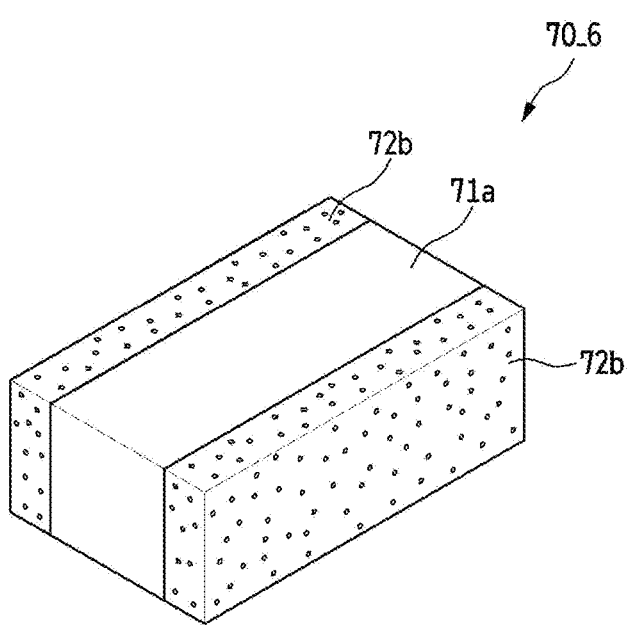

FIG. 18 is a perspective view of another embodiment of a cushion member.

Referring to FIG. 18, a cushion member 70_6 may include low hardness layers 72*b* and a high hardness layer 71*a*, and may be the same as the cushion member 70 in an embodiment of FIG. 6 except that the low hardness layers 72*b* include pores.

Since the low hardness layers 72*b* include the pores, the low hardness layers 72*b* may be softly formed, and may accordingly provide lower hardness in the edge areas.

Figure 19:
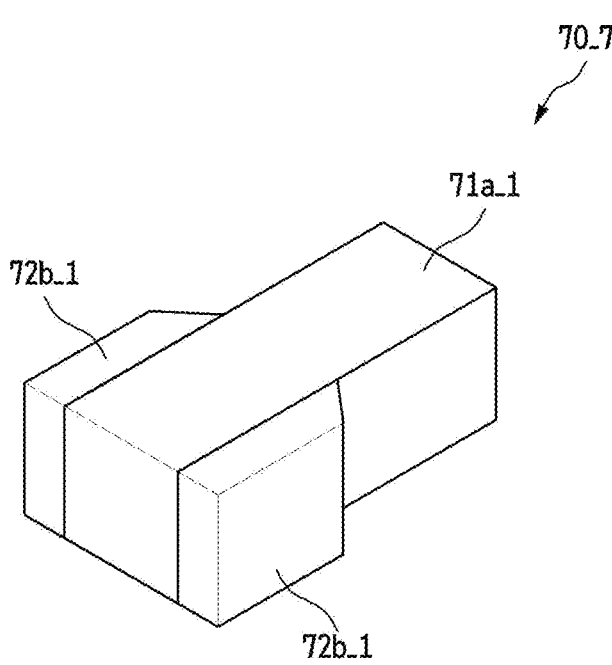

FIG. 19 is a perspective view of another embodiment of a cushion member.

Referring to FIG. 19, a cushion member 70_7 may include low hardness layers 72*b*_1 and a high hardness layer 71*a*_1, and may be the same as the cushion member 70 of FIG. 6 except that the low hardness layers 72*b*_1 are disposed only in partial sections of the high hardness layer 71*a*_1. By partially forming the low hardness layers 72*b*_1 only in edge sections where stress concentration should be solved, a manufacturing cost of the cushion member 70_7 may be reduced.

Figure 20:
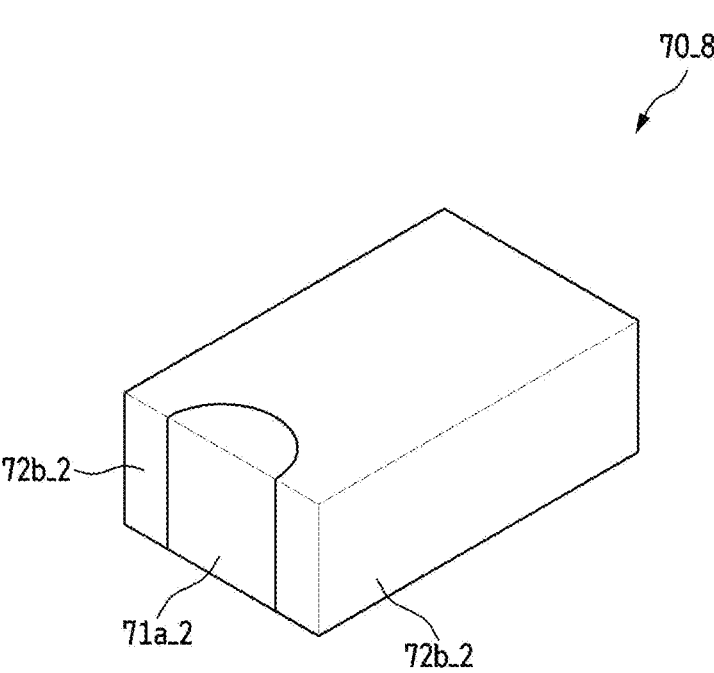

FIG. 20 is a perspective view of another embodiment of a cushion member.

Referring to FIG. 20, a cushion member 70_8 includes a low hardness layer 72*b*_2 and a high hardness layer 71*a*_2, but is different from the cushion member 70 in an embodiment of FIG. 6 in that the high hardness layer 71*a*_2 has a semicircular cross-sectional shape. When the low hardness layer 72*b*_2 is entirely formed and the high hardness layer 71*a*_2 is included only in a partial section, a manufacturing cost of the cushion member 70_8 may be reduced, and a relatively low hardness distribution may be entirely increased, such that a stress concentration solving effect may be further improved.

Figure 21:
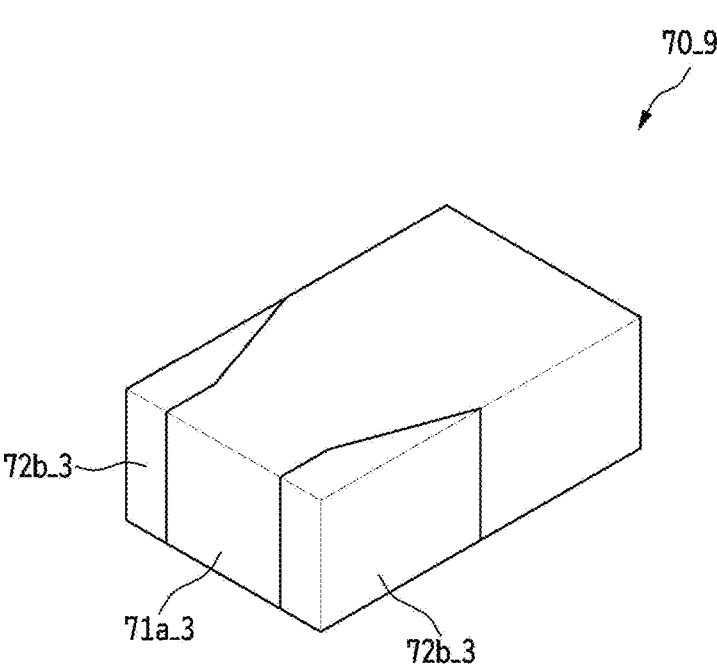

FIG. 21 is a perspective view of another embodiment of a cushion member.

Referring to FIG. 21, a cushion member 70_9 may include low hardness layers 72*b*_3 and a high hardness layer 71*a*_3, but may be the same as the cushion member 70 in an embodiment of FIG. 6 except that the low hardness layers 71*b*_3 each have a trapezoidal cross-sectional shape. Since the low hardness layers 72*b*_3 each include the trapezoidal cross-sectional shape, stress concentrated in the edge areas may be dispersed at the rear, such that a cushion effect may be further improved.

As described above, the cushion member 70 includes the composite layers 71 and 72 having relatively low hardness and relatively high hardness. Accordingly, when an external force occurs, duration may be increased and an impulsive force may be decreased, and thus, it is possible to protect the loading target element 10 and prevent damage to the loading target element 10.

However, the effects of the disclosure are not restricted to the one set forth herein. The above and other effects of the disclosure will become more apparent to one of daily skill in the art to which the disclosure pertains by referencing the claims.

It will be able to be understood by one of ordinary skill in the art to which the disclosure belongs that the disclosure may be implemented in other predetermined forms without changing the technical spirit or essential features of the disclosure. Therefore, it is to be understood that the embodiments described above are illustrative rather than being restrictive in all features. It is to be understood that the scope of the disclosure are defined by the claims rather than the detailed description described above and all modifications and alterations derived from the claims and their equivalents fall within the scope of the disclosure.

What is claimed is:

1. A tray comprising:
   a tray body; and
   an accommodation portion disposed in the tray body and accommodating a loading target element, the accommodation portion including:
   an accommodation bottom portion overlapping a first surface of the loading target element; and
   accommodation sidewall portions facing second surfaces of the loading target element disposed along a circumferential direction of the accommodation portion in a direction perpendicular to the first surface, the accommodation sidewall portions including:
   cushion members each including a cushion surface facing a partial area of the second surfaces of the loading target element, a cushion member of the cushion members including:
   a high hardness layer having first hardness; and
   a pair of low hardness layers in contact with the high hardness layer and having second hardness lower than the first hardness,
   wherein
   the high hardness layer is disposed between the pair of low hardness layers.

2. The tray of claim 1, wherein the loading target element includes a circuit member disposed in a partial area of the second surfaces, and
   the cushion surface of the cushion member faces the circuit member.

3. The tray of claim 2, wherein the circuit member includes a plurality of avoidance grooves defined at regular intervals along a length direction thereof, and
   a plurality of cushion members overlaps the plurality of avoidance grooves, respectively.

4. The tray of claim 3, wherein the plurality of cushion members is disposed within a width of the circuit member along the length direction of the circuit member, and the plurality of cushion members includes a first cushion member overlapping an avoidance groove defined in a middle among the plurality of avoidance grooves and a pair of second cushion members spaced apart from each other with the first cushion member interposed therebetween.

5. The tray of claim 4, wherein widths of the first cushion member and a second cushion member of the pair of second cushion members along the length direction of the circuit member are different from each other.

6. The tray of claim 2, wherein the tray body includes a coupling groove which is disposed adjacent to the accommodation portion and to which the cushion member is coupled.

7. The tray of claim 6, wherein the cushion member includes a cushion bottom surface in contact with the coupling groove, a cushion top surface opposite to the cushion bottom surface, and a plurality of cushion side surfaces disposed along the circumferential direction between the cushion bottom surface and the cushion top surface, and any one of the plurality of cushion side surfaces is the cushion surface facing the circuit member.

8. The tray of claim 7, wherein another of the plurality of cushion side surfaces is a cushion engagement surface disposed in a direction opposite to the cushion surface, and the coupling groove includes a lower accommodation groove in contact with the cushion bottom surface of the cushion member and a side surface support portion in contact with a cushion coupling surface.

9. The tray of claim 7, wherein a height of the cushion member from the cushion bottom surface to the cushion top surface is smaller than a height of the coupling groove.

10. The tray of claim 7, wherein widths of the high hardness layer and a low hardness layer of the pair of low hardness layers along a direction perpendicular to a cushion side surface of the plurality of cushion side surfaces are different from each other.

11. The tray of claim 2, wherein the accommodation sidewall portions include guide portions facing remaining second surfaces excluding the circuit member among the second surfaces of the loading target element.

12. The tray of claim 11, wherein the guide portions each protrude toward the remaining second surfaces of the loading target element accommodated in the accommodation portion.

13. The tray of claim 11, wherein one second surface of the second surfaces of the loading target element faces the cushion surface with an interval defined therebetween, and the remaining second surfaces of the second surfaces excluding the one second surface face the guide portions with an interval defined therebetween.

14. The tray of claim 1, wherein the tray body further includes a guide groove defined adjacent to the accommodation portion and guiding the loading target element so that the loading target element is introduced into and extracted from the accommodation portion.

15. The tray of claim 1, wherein the cushion member further includes adhesive layers disposed between the high hardness layer and the pair of low hardness layers.

16. The tray of claim 1, wherein the cushion member further includes medium hardness layers disposed between the high hardness layer and the pair of low hardness layers and having hardness lower than the first hardness of the high hardness layer and higher than the second hardness of the pair of low hardness layers.

17. The tray of claim 16, wherein the cushion member further includes ultra-low hardness layers disposed at outermost portions of the pair of low hardness layers and having hardness lower than the second hardness of the pair of low hardness layers.

18. A tray comprising:

a tray body; and an accommodation portion disposed in the tray body and accommodating a loading target element, the accommodation portion including:

an accommodation bottom portion overlapping a first surface of the loading target element; and accommodation sidewall portions facing second surfaces of the loading target element disposed along a circumferential direction of the accommodation portion in a direction perpendicular to the first surface, the accommodation sidewall portions including:

cushion members each including:

a first layer facing partial areas of the second surfaces of the loading target element and having a first hardness; and a second layer disposed in a direction opposite to the first layers and having a second hardness higher than the first hardness of the first layers, wherein the loading target element includes a circuit member disposed in a partial area of the second surfaces of the loading target element, and the first layer of the cushion member faces the circuit member.

19. The tray of claim 18, wherein the tray body includes a coupling groove to which a cushion member of the cushion members is coupled, the coupling groove includes a lower accommodation groove in contact with bottom surfaces of the first and second layers and a side surface support portion in contact with the second layer, and a first surface of the second layer contacts the first layer and a second surface of the second layer opposite to the first surface contacts the side surface support portion.

\* \* \* \* \*